United States Patent [19]
Zandbergen et al.

[11] Patent Number: 5,866,283
[45] Date of Patent: Feb. 2, 1999

[54] METHOD OF MONITORING A PHOTOLITHOGRAPHIC PROCESS THROUGH UTILIZATION OF FRACTIONAL RADIANT ENERGY TEST PATTERN

[75] Inventors: Peter Zandbergen; Casparus A. H. Juffermans; Wendy F. J. Gehoel-Van Ansem, all of Eindhoven, Netherlands

[73] Assignee: U.S. Philips Corporation, New York, N.Y.

[21] Appl. No.: 929,537

[22] Filed: Sep. 15, 1997

[30] Foreign Application Priority Data

Sep. 19, 1996 [EP] European Pat. Off. .............. 96202617

[51] Int. Cl.$^6$ ........................................................ G03F 9/00
[52] U.S. Cl. .............................................. 430/30; 430/394
[58] Field of Search ...................................... 430/30, 394

[56] References Cited

U.S. PATENT DOCUMENTS 5,516,605  5/1996  Hwang ...................................... 430/30
5,567,575  10/1996  Hirama ................................... 430/394

Primary Examiner—Christopher G. Young
Attorney, Agent, or Firm—Steven R. Biren

[57] ABSTRACT

A method of monitoring a photolithographic process whereby a test pattern (4) is imaged a number of times side by side with the same radiant energy on a photoresist layer (1) provided on a surface (2) of a substrate (3), but in a series of different irradiation times, after which the photoresist is developed. The irradiation dose or "energy-to-clear" with which the photoresist becomes just soluble in developer can thus be ascertained. The radiant energy with which the test pattern is imaged on the photoresist is only a fraction here of the radiant energy available in the process itself for imaging patterns on photoresist which is to be monitored. The method is thus suitable for monitoring a photolithographic process in which pulsed laser radiation is used for the pattern irradiation. The energy-to-clear can be accurately determined also in these processes.

4 Claims, 2 Drawing Sheets

METHOD OF MONITORING A PHOTOLITHOGRAPHIC PROCESS THROUGH UTILIZATION OF FRACTIONAL RADIANT ENERGY TEST PATTERN

BACKGROUND OF THE INVENTION

The invention relates to a method of monitoring a photolithographic process whereby a test pattern is imaged a number of times side by side with the same radiant energy but in a series of different irradiation times on a photoresist layer provided on a surface of a substrate, whereupon the photoresist is developed.

The test pattern may be a rectangle. A number of these rectangles is then imaged on the photoresist side by side, said rectangles having a length and a width, for example, of a few millimeters. It is then simple to ascertain with the naked eye at which irradiation time the photoresist has just become soluble in developer during the development of the photoresist. Since the irradiation energy used for this is known, the irradiation dose is thus determined at which the photoresist can be just removed from the surface. This irradiation dose is sometimes called the energy-to-clear.

In the photolithographic process to be monitored, a layer of photoresist is irradiated in a pattern and subsequently developed, such that photoresist patterns are formed. The method mentioned in the opening paragraph may be used for optimizing the process to be monitored, for example as regards the thickness of the photoresist layer, and also to check from time to time whether the process still functions satisfactorily. If such a series of test patterns is imaged in different locations on the substrate, it can also be tested whether the process takes place homogeneously over the surface of the substrate.

It is known to determine the energy-to-clear by means of a rectangular test pattern which is formed by means of a diaphragm. The photoresist is irradiated within the rectangle of the test pattern, but not outside it. The series of irradiation times is chosen so as to lie around a nominal value which corresponds to the expected energy-to-clear. The irradiation times, and thus the irradiation doses in the series, differ from one another, for example, by 2% of the nominal value each time.

It is found in practice that the known method is not suitable for monitoring a photolithographic process in which pulsed laser radiation from, for example, a KrF excimer laser is used for the pattern irradiation. This laser radiation is used in projection devices with which patterns having minimum dimensions of 0.25 $\mu$m are imaged on photoresist, for example, in the PAS-5500/90 and the PAS-5500/300 of the ASML Company. An irradiation dose to be realized can be set on the device. When such devices are used, it is found that the accuracy with which a set irradiation dose is realized is practically independent of the value of this dose. It is found in practice that irradiation doses with values of up to approximately 100 mJ/cm$^2$ can all be realized with the same accuracy of approximately ±0.15 mJ/cm$^2$. Usual pattern irradiations are carried out with irradiation doses of 5 to 20 mJ/cm$^2$, the test patterns mentioned above accordingly with differences between doses of 0.1 to 0.4 mJ/cm$^2$. The pattern irradiations can be carried out with a sufficient accuracy, the energy-to-clear irradiations cannot.

The dose necessary for rendering the photoresist just capable of development in addition depends on the size of the pattern imaged on the photoresist. Small patterns must be irradiated longer than large ones. When monitoring the lithography process, where test patterns are preferably used which are observable to the naked eye, this should be taken into account. To render a test pattern imaged in the form of a rectangle having sides of, for example, 2 and 4 mm on the photoresist capable of development, an irradiation dose is necessary which is only half as great as that which is necessary for rendering sub-micron patterns imaged on the photoresist capable of development. Dose differences of as little as 0.05 to 0.2 mJ/cm$^2$ would accordingly have to be realized for determining the energy-to-clear by means of such a large test pattern.

SUMMARY OF THE INVENTION

The invention has for its object to improve the method mentioned in the opening paragraph to such an extent that it is also suitable for monitoring a photolithographic process in which pulsed laser radiation is used for the pattern irradiation.

The method according to the invention is for this purpose characterized in that the radiant energy with which the test pattern is imaged on the photoresist is only a fraction of the radiant energy which is available in the process to be monitored for imaging patterns on photoresist. Only a fraction of the irradiation dose set on the device is accordingly used during the determination of the energy-to-clear. For example, if only 10% of the radiation is utilized, differences of approximately 0.5 to 2 mJ/cm$^2$ should be adjusted in order to realize the differences in irradiation dose mentioned above of 0.05 to 0.2 mJ/cm$^2$ on the photoresist. These former differences can indeed be realized with accuracy.

Test patterns can be imaged with said small radiant energy in the known method in which a rectangular test pattern is formed in that the radiation is limited to a rectangle by means of a diaphragm, while a filter with a transmission of, for example, 10% is included in the radiation path. Preferably, however, the test pattern is formed on a photoresist mask which is projected on the photoresist, in particular through a window with a limited radiation transmission which is provided in a layer impermeable to radiation and lying on the photoresist mask. The energy-to-clear can thus be determined in a simpler and more reliable manner.

BRIEF DESCRIPTION OF THE DRAWINGS

The invention will be explained in more detail below by way of example with reference to a drawing. In the drawing.

DESCRIPTION OF THE PREFERRED EMBODIMENTS

Figure 1:
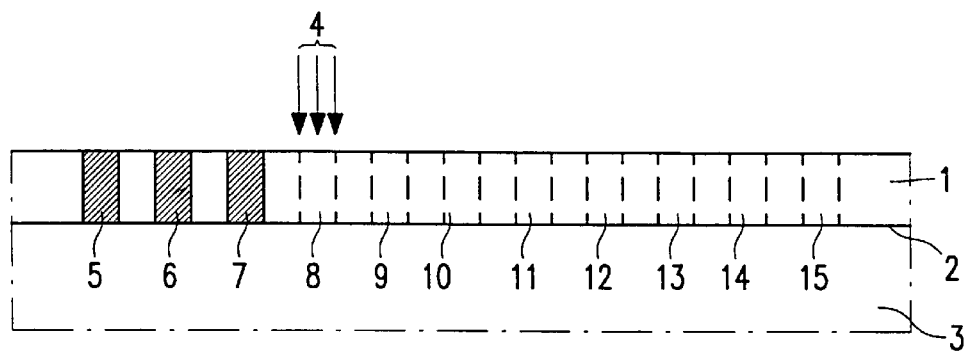
FIG. 1 diagrammatically and in cross-section shows a stage in the implementation of the method according to the invention, FIG. 2 diagrammatically and in plan view shows the surface after the development of the photoresist.

FIG. 1 diagrammatically and in cross-section shows a stage in the implementation of the method according to the invention whereby a test pattern 4 is imaged a number of times side by side a layer of photoresist 1, negative photoresist in this case, provided on a surface 2 of a substrate 3.

Figure 2:
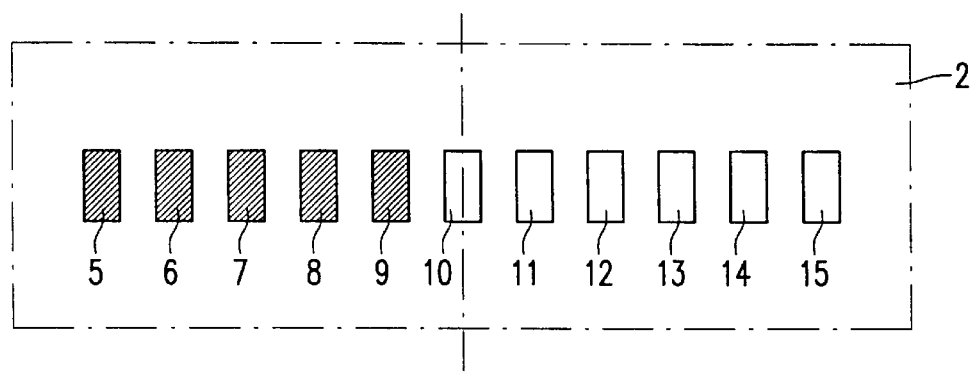

The regions 5 to 7 where the irradiation has already taken place are shown hatched, and the region 8 where the irradiation is taking place and the regions 9 to 15 where the irradiation is yet to take place are shown next to the former regions. Imaging takes place with the same radiant energy, but in a series of different irradiation times, in this example rising irradiation times from region 1 to region 15. The photoresist 1 is subsequently developed. FIG. 2 is a plan view of the surface 2 after the photoresist has been developed. It is found that the photoresist on regions 5 to 9 does not dissolve in the developer, whereas the photoresist on the regions 10 to 15 does. The time during which region 10 was irradiated is accordingly exactly long enough for rendering the photoresist soluble in the developer. Since the radiant energy used for this is known, the irradiation dose with which the photoresist can just be removed from the surface has thus been determined. This irradiation dose is called the energy-to-clear $E_0$.

The test pattern in this example is a rectangle. A number of these rectangles 5 to 15 is imaged on the photoresist 1. They have a length and a width of, for example, a few millimeters each. It can then be simply ascertained with the naked eye during the development of the photoresist at which irradiation time the photoresist has just become soluble in developer.

A layer of photoresist is irradiated in a pattern and subsequently developed in the photolithographic process to be monitored. The method illustrated in FIGS. 1 and 2 can be used for optimizing the process under observation, for example as regards the thickness of the photoresist layer, and also for checking from time to time whether the process still takes place satisfactorily.

Figure 3:
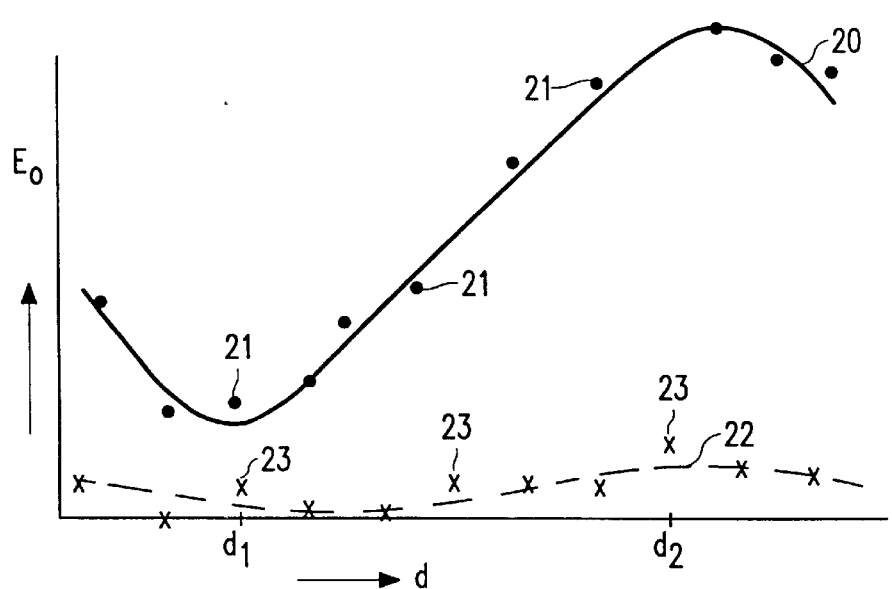
FIG. 3 is a diagram showing the interrelation between the energy-to-clear $E_0$ and the thickness d of a photoresist layer.

FIG. 3 is a diagram showing the interrelationship between the energy-to-clear $E_0$ and the thickness d of a photoresist layer. Curve 20 drawn through measured points 21 shows this interrelationship measured by the method according to the invention. The energy-to-clear is found to have a minimum at a layer thickness $d_1$ and a maximum at a layer thickness $d_2$. Preferably, a photoresist layer having a thickness $d_2$ is now used in the lithographic process to be monitored. In practice, the photoresist layer present on a surface will be somewhat thinner or thicker locally than the desired thickness. If the desired thickness is $d_2$, these somewhat thicker and thinner portions can be developed after irradiation, in the case of the desired thickness being $d_1$ they cannot, and photoresist residues may remain in undesirable locations after development. The lithographic process to be monitored can thus be optimized.

Figure 4:
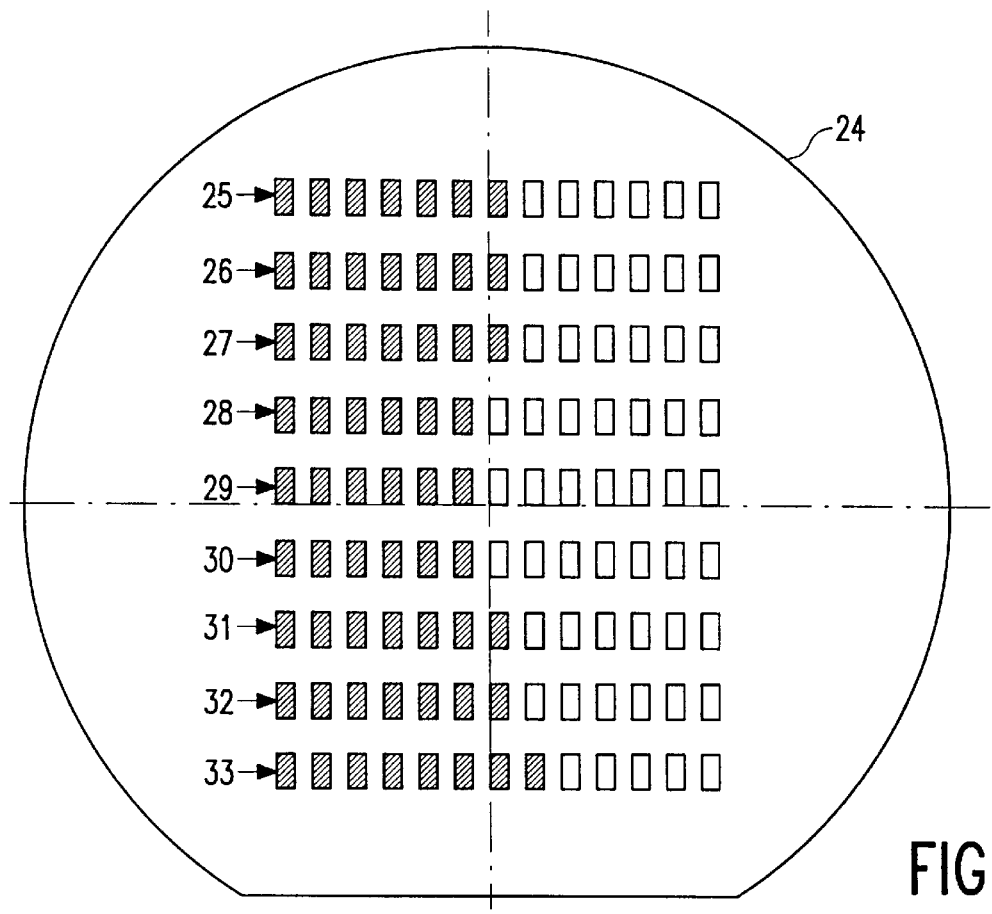
FIG. 4 shows a silicon wafer on which a number of series of test patterns is imaged in different locations on the surface, and FIGS. 5 and 6 diagrammatically show a photoresist mask provided with a test pattern in plan view and in cross-section, respectively.

FIG. 4 shows a silicon wafer 24 on which a number of series of test patterns 25 to 33 are imaged in different locations on the surface. It can also be ascertained in this case whether the process takes place homogeneously over the wafer surface. In the series shown, the irradiation time increases from left to right. The photoresist has not disappeared during development on the left on the wafer, it has on the right. It is found in this example that the energy-to-clear for the photoresist is greater at the edge of the wafer than in the center of the wafer. Whether this is sufficiently homogeneous depends on the requirements imposed on the process which is being monitored.

The series of irradiation times is chosen to lie around a nominal value which corresponds to the expected energy-to-clear $E_0$. The irradiation times, and thus the irradiation doses in the series differ progressively from the nominal value, for example by 2% each time.

It is found in the use of projection devices with which patterns having minimum dimensions of 0.25 μm are imaged on photoresist and in which pulsed laser radiation from, for example, a KrF excimer laser is used for the pattern irradiation, that the accuracy with which an adjusted irradiation dose is realized is substantially independent of the amount of this dose. It is found in practice that irradiation doses with a value of up to approximately 100 mJ/cm$^2$ can all be realized with the same accuracy of approximately ±0.15 mJ/cm$^2$. Usual pattern irradiations are carried out with an irradiation dose of 5 to 20 mJ/cm$^2$, and the test patterns mentioned above accordingly with mutual dose differences of 0.1 to 0.4 mJ/cm$^2$. The pattern irradiations can be carried out with a sufficient accuracy, the energy-to-clear irradiations cannot.

It is further found that the energy-to-clear $E_0$ depends on the size of the pattern imaged on the photoresist. An irradiation dose of only half the value required for rendering sub-micron patterns imaged on the photoresist capable of development is required for rendering a test pattern capable of development, if the latter is imaged on the photoresist in the form of a rectangle having sides of, for example, 2 and 4 mm. Dose differences of no more than 0.05 to 0.2 mJ/cm$^2$ should accordingly be realized in the determination of the energy-to-clear by means of such a test pattern.

The method according to the invention reduces the radiant energy with which the test pattern is imaged on the photoresist to only a fraction of the radiant energy available in the pattern imaging process on photoresist which is to be monitored. Only a fraction of the irradiation dose set on the device is utilized during the determination of the energy-to-clear $E_0$. To realize the differences in irradiation dose of 0.05 to 0.2 mJ/cm$^2$ on the photoresist as mentioned above, for example with only 10% of the radiation being utilized, differences of approximately 0.5 to 2 mJ/cm$^2$ should be adjusted. These differences can indeed be realized with accuracy.

Curve 21 in FIG. 3 shows the energy-to-clear $E_0$ as a function of the thickness d of the photoresist layer determined by the method, wherein only a fraction of the irradiation dose set on the device is utilized. The dose set is plotted on the vertical axis, only a fraction being used accordingly. Curve 22 shows the same gradient determined by a method in which the entire irradiation dose set on the device is utilized. The dose set is again plotted on the vertical axis here. The former dose (curve 20) is ten times greater than the latter dose (curve 22) if the fraction amounts to 10%. The accuracy with which the adjusted irradiation dose is realized (±0.15 mJ/cm$^2$) is substantially the same for the two curves. The optimum photoresist thickness $d_2$, however, can be determined to a much higher accuracy by the method according to the invention. If the entire irradiation dose set on the device were utilized during imaging of the test patterns, in the test results as shown in FIG. 4 would also the boundary between soluble and insoluble in developer would be much vaguer.

Figure 5:
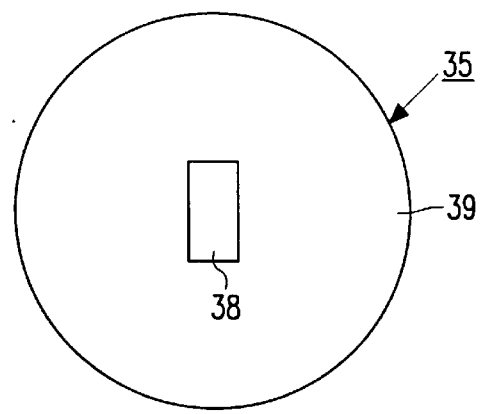
Figure 6:
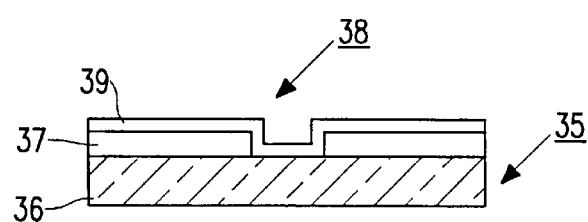

Test patterns can be imaged with said small radiant energy in that the radiation is limited to a rectangle by means of a diaphragm and in that a filter having a transmission of, for example, 10% is included in the radiation path. Preferably, however, the test pattern is formed on a photomask as shown in plan view in FIG. 5 and in cross-section in FIG. 6, which is projected on the photoresist. The photomask 35 comprises a transparent glass substrate 36 provided with a chromium layer 37 which is impermeable to radiation. A window 38 is formed in a usual manner in the chromium layer. The window 38 as a result has a limited transmission to radiation, for example only 10%. This limited transmission to radiation is obtained here in that a chromium layer 39 is deposited on the mask to a thickness such that the desired radiation transmission is obtained.

What is claimed is:

1. A method of monitoring a photolithographic process whereby a test pattern is imaged a number of times side by side with the same radiant energy but in a series of different irradiation times on a photoresist layer provided on a surface of a substrate, whereupon the photoresist is developed, characterized in that the radiant energy with which the test pattern is imaged on the photoresist is only a fraction of the radiant energy which is available in the process to be monitored for imaging patterns on photoresist.

2. A method as claimed in claim 1, characterized in that the test pattern is formed on a photomask which is projected on the photoresist.

3. A method as claimed in claim 2, characterized in that the test pattern is formed by a window having a limited radiation transmission which is provided in a layer which is impermeable to radiation and is provided on the photomask.

4. A method as claimed in claim 3, characterized in that the test pattern is formed through etching of a window in a radiation-impermeable chromium layer provided on a photomask plate, and in that subsequently a chromium layer is deposited on the photomask plate to a thickness such that the desired limited radiation transmission is achieved.

* * * * *